US010756259B2

(12) United States Patent
Ahn et al.

(10) Patent No.: US 10,756,259 B2
(45) Date of Patent: Aug. 25, 2020

(54) SPIN ORBIT TORQUE MRAM AND MANUFACTURE THEREOF

(71) Applicant: Applied Materials, Inc., Santa Clara, CA (US)

(72) Inventors: Jaesoo Ahn, San Jose, CA (US); Chando Park, Palo Alto, CA (US); Hsin-wei Tseng, San Jose, CA (US); Lin Xue, San Jose, CA (US); Mahendra Pakala, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/290,621

(22) Filed: Mar. 1, 2019

(65) Prior Publication Data

US 2020/0161542 A1 May 21, 2020

Related U.S. Application Data

(60) Provisional application No. 62/770,011, filed on Nov. 20, 2018.

(51) Int. Cl.
*H01L 27/00* (2006.01)
*H01L 43/00* (2006.01)
(Continued)

(52) U.S. Cl.
CPC .............. *H01L 43/12* (2013.01); *H01L 43/02* (2013.01); *H01L 43/10* (2013.01); *H01L 27/222* (2013.01)

(58) Field of Classification Search
CPC ... H01L 27/222; H01L 27/228; H01L 27/226; H01L 27/11565; H01L 27/224;
(Continued)

(56) References Cited

U.S. PATENT DOCUMENTS 8,611,055 B1   12/2013   Pakala et al.
8,802,451 B2 *  8/2014   Malmhall ............... B82Y 10/00
                                                    438/3
(Continued)

FOREIGN PATENT DOCUMENTS

KR        101829452 B1     2/2018

OTHER PUBLICATIONS

International Search Report and Written Opinion for PCT/US2018/055886 dated Feb. 3, 2020.

*Primary Examiner* — Nikolay K Yushin
(74) *Attorney, Agent, or Firm* — Patterson + Sheridan, LLP (57) ABSTRACT

The bottom-pinned spin-orbit torque (SOT) MRAM devices are fabricated to form high quality interfaces between layers including the spin-orbit torque (SOT) layer and the free layer of the magnetic tunnel junction (MTJ) by forming those layers under vacuum, without breaking vacuum in between formation of the layers. An encapsulation layer is used as an etch stop and to protect the free layer. The encapsulation layer is etched back prior to the deposition of a metal layer. The metal layer forms a plurality of metal lines that are electrically connected to two or more sides of the SOT layer and are electrically coupled to the SOT layer to transfer current through the SOT layer. The metal lines are not in contact with a top surface of the SOT layer which has a dielectric layer disposed thereon.

20 Claims, 10 Drawing Sheets

(51) Int. Cl.
*H01L 43/12* (2006.01)
*H01L 43/02* (2006.01)
*H01L 43/10* (2006.01)
*H01L 27/22* (2006.01)

(58) Field of Classification Search
CPC ......... H01L 43/12; H01L 43/02; H01L 43/10; H01L 43/08
See application file for complete search history.

(56) References Cited

U.S. PATENT DOCUMENTS

| | | | |
|---|---|---|---|
| 9,564,582 B2 | 2/2017 | Pakala et al. | |
| 9,768,229 B2 | 9/2017 | Braganca et al. | |
| 9,824,735 B1 | 11/2017 | Kan et al. | |
| 10,276,784 B1 * | 4/2019 | Yu | G11C 11/1675 |
| 10,497,858 B1 * | 12/2019 | Ahn | H01L 27/222 |
| 10,510,547 B2 * | 12/2019 | Roy | H01L 27/11578 |
| 2003/0180968 A1 * | 9/2003 | Nallan | H01L 23/564 |
| | | | 438/3 |
| 2011/0194341 A1 * | 8/2011 | Gaidis | G11C 11/16 |
| | | | 365/171 |
| 2016/0225423 A1 | 8/2016 | Naik et al. | |
| 2016/0351799 A1 | 12/2016 | Xue et al. | |
| 2017/0352702 A1 | 12/2017 | Braganca et al. | |
| 2018/0123031 A1 | 5/2018 | Adelmann et al. | |
| 2018/0190902 A1 * | 7/2018 | Garello | H01L 27/226 |
| 2019/0206931 A1 * | 7/2019 | Gajek | H01L 27/228 |
| 2019/0207094 A1 * | 7/2019 | Gajek | H01L 27/228 |
| 2019/0207102 A1 * | 7/2019 | Gajek | H01L 27/228 |
| 2019/0259946 A1 * | 8/2019 | Makala | H01L 27/2427 |

* cited by examiner

SPIN ORBIT TORQUE MRAM AND MANUFACTURE THEREOF

PRIORITY CLAIM

The instant application claims priority to U.S. Provisional Patent Application No. 62/770,111, "Spin Orbit Torque MRAM and Manufacture Thereof," filed Nov. 20, 2018, and incorporated by reference in its entirety herein.

BACKGROUND

Field

Embodiments of the present disclosure generally relate to spin-orbit torque magnetoresistive random-access memory (SOT-MRAM).

Description of the Related Art

Magnetoresistive random-access memory (MRAM) stores data using magnetic storage elements. MRAM can take various forms, including spin-transfer torque (STT) MRAM in which a spinning direction of the electrons is reversed using a spin-polarized current using a magnetic tunnel junction (MTJ) stack. The spin-polarized current is applied to STT-MRAM devices in an in-plane direction or a perpendicular direction relative to the MTJ stack. In contrast, spin-orbit torque (SOT) MRAM causes the switching of spinning direction of the electrons by applying a current to a heavy metal layer, or spin-orbit torque (SOT) layer, adjacent the MTJ stack. The current is applied to the SOT layer in an in-plane direction relative to the MTJ stack. Fabrication of SOT-MRAM devices can be challenging since conventional SOT-MRAM structures can have poor thermal stability and current flow loss due to a mismatch in size between the MTJ stack and SOT layer.

Thus, there remains a need in the art for a more robust SOT-MRAM device and methods of manufacture thereof.

SUMMARY

Embodiments of the present disclosure provide improved SOT-MRAM devices and methods of manufacture thereof. In one example, a method of forming a memory device includes depositing an encapsulation layer on a first structure, the first structure includes a magnetic tunnel junction stack, a spin-orbit torque layer formed on the magnetic tunnel junction stack, and a dielectric capping layer formed over the spin-orbit torque layer. The method further includes depositing a dielectric layer on the encapsulation layer; forming a trench in the dielectric layer by removing a portion of the dielectric layer and a portion of the encapsulation layer; and depositing, via at least one of chemical vapor deposition (CVD) or physical vapor deposition (PVD), a metal layer in the trench. The metal layer is deposited on top of the dielectric layer and surrounding the spin-orbit torque layer and the dielectric capping layer, the metal layer is in direct contact with a sidewall of the spin-orbit torque layer.

In another example, a method of forming a memory device includes depositing a first dielectric layer on an encapsulation layer formed over a first structure, the first structure includes a magnetic tunnel junction stack, a spin-orbit torque layer formed on the magnetic tunnel junction stack, and a dielectric capping layer formed over the spin-orbit torque layer. The method further includes forming a trench in the first dielectric layer by removing a portion of the dielectric layer and a portion of the encapsulation layer and depositing, via at least one of chemical vapor deposition (CVD) or physical vapor deposition (PVD), a metal layer in the trench. The metal layer is deposited on top of the dielectric layer and surrounding the spin-orbit torque layer and the dielectric capping layer, the metal layer being in direct contact with a sidewall of the spin-orbit torque layer. Further in this example, the method includes depositing a second dielectric fill layer on the metal layer.

In another example, a method of forming a memory device includes depositing, on a substrate positioned in a process chamber under vacuum pressure, a magnetic tunnel junction stack and depositing the spin-orbit torque layer on the free layer of the magnetic tunnel junction stack while the magnetic tunnel junction stack remains under vacuum pressure. The method further includes depositing the dielectric capping layer on the spin-orbit torque layer and depositing an encapsulation layer on a first structure, the first structure includes the magnetic tunnel junction stack, the spin-orbit torque layer, and the dielectric capping layer formed over the spin-orbit torque layer. Further in this example, the method includes depositing a dielectric layer on the encapsulation layer; forming a trench in the dielectric layer by removing a portion of the dielectric layer and a portion of the encapsulation layer; and depositing, via at least one of chemical vapor deposition (CVD) or physical vapor deposition (PVD), a metal layer in the trench, the metal layer being deposited on top of the dielectric layer and surrounding the spin-orbit torque layer and the dielectric capping layer, the metal layer being in direct contact with a sidewall of the spin-orbit torque layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally include bottom-pinned spin-orbit torque magnetoresistive random-access memory (SOT-MRAM) and methods of manufacture thereof. Top-pinned SOT-MRAM devices can have poor thermal stability during fabrication operations such as annealing, which can negatively impact the magnetic and electrical properties of the SOT-MRAM device. Further, top-pinned SOT-MRAM devices can experience current flow loss due to a width difference between the MTJ stack and the SOT layer, which can reduce switching efficiency of the SOT-MRAM device. Additionally, top-pinned structures use the SOT layer as an etch stop which can negatively impact the quality of the SOT layer. Conventional methods of fabrication of bottom-pinned SOT-MRAM can be challenging, for example, because of defects that can occur in a free layer of a magnetic tunnel junction (MTJ) stack. Defects can occur in the free layer, for example, because of its exposure to ambient air during the patterning process of MTJ stack before depositing SOT layer. Defects in the free layer can cause challenges in the deposition of subsequent layers on the free layer, including the spin-orbit torque (SOT) layer. Thus, defects in the free layer can negatively impact SOT-MRAM device performance.

Using the systems and methods discussed herein, bottom-pinned SOT-MRAM devices are fabricated by depositing the MTJ stack and SOT layers in-situ without breaking vacuum to form a high-quality interface between the MTJ stack and the SOT layer. The MTJ stack and the SOT layer can be formed in a single process chamber or in an integrated tool that includes a plurality of process chambers. Substrates transferred among and between the process chambers of the integrated tool are kept under vacuum. A high-quality interface between the SOT layer and the MTJ stack promotes a strong pinning anisotropy field (Hk) and a high thermal stability up to temperatures on the order of 450° C. The bottom-pinned SOT-MRAM structures fabricated herein electrically couple metal lines to two or more sides of the SOT layer to transfer current therethrough, without the metal lines contacting the top of the SOT layer which can cause current flow loss.

Figure 1:
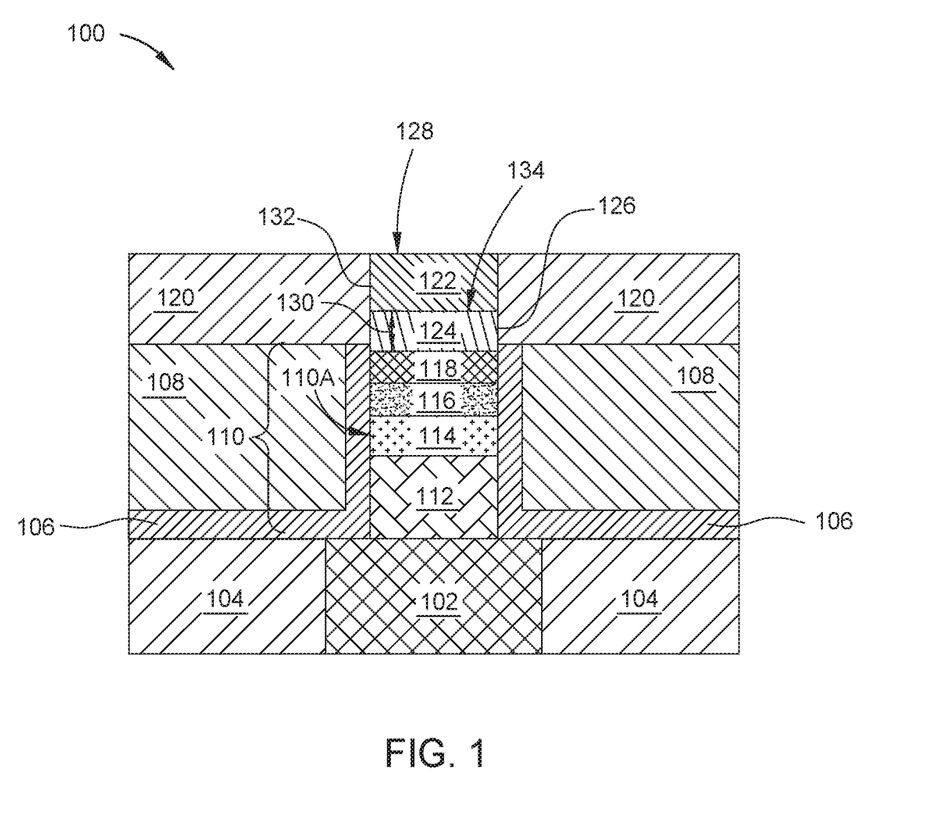
FIG. 1 is a cross-sectional view of a bottom-pinned spin-orbit torque MRAM device fabricated according to embodiments of the present disclosure.

FIG. 1 is a cross-sectional view of a bottom-pinned spin-orbit torque MRAM (SOT-MRAM) device 100 fabricated according to embodiments of the present disclosure. The SOT-MRAM device 100 in FIG. 1 includes an MTJ stack 110 formed on a metal contact 102 and a dielectric layer such as an oxide layer 104 is formed to surround the metal contact 102. The MTJ stack 110 includes a pinning layer 112 formed on the metal contact 102 that is also in contact with a reference layer 114. The pinning layer 112 can be formed as a single layer or as a plurality of interlayers, and can be formed from materials such as cobalt (Co) on a single seed layer (not shown here) or a plurality of seed layers. In other examples of the pinning layer 112, platinum (Pt) can be used alone or in combination with other materials. The reference layer 114 is formed under a tunnel barrier layer 116. The tunnel barrier layer 116 can be formed as a single layer or as a plurality of interlayers, and can be formed from one or more oxides such as magnesium oxide (MgO). The reference layer 114 can be formed as a single layer or as a plurality of interlayers. The reference layer 114 can include one or more of CoFe, CoFeB, FeB, Ta, Mo, ruthenium (Ru) or combinations thereof. The MTJ stack 110 further includes an outermost layer, a free layer 118 that is in direct contact with an SOT layer 124 and the tunnel barrier layer 116. The free layer 118 can be formed as a single layer or as a plurality of interlayers. The free layer 118 can be formed to include CoFeB and/or other magnetic materials. Depending upon the example, each of the free layer 118, the tunnel barrier layer 116, the reference layer 114, and the pinning layer 112 can be a single layer or can include interlayers. In some examples of the MTJ stack 110, additional layers can be included in between the pinning layer 112 and the free layer 118. The reference layer 114, tunnel barrier layer 116, and the free layer 118 are configured such that, electrical current through the tunnel barrier layer 116 is low when the directions of electron spin polarizations of the reference layer 114 and the free layer 118 are aligned in parallel, resulting in a low-resistance state of the MTJ stack 110. When the polarization directions of the reference layer 114 and the free layer 118 are anti-parallel, electrical resistance of the MTJ stack 110 becomes large (increases). The SOT layer 124 is deposited on top of the MTJ stack 110, and a dielectric capping layer 122 is deposited on the SOT layer 124. The SOT layer 124 can be formed from tungsten (W), tantalum (Ta), platinum (Pt), or combinations or alloys thereof. Depending upon the example, a thickness 130 of the SOT layer 124 can be from about 3 mm thick to about 10 mm thick. The MTJ stack 110 and the SOT layer 124 are formed in a series of operations discussed below that are performed under vacuum. The dielectric capping layer 122 can be formed from oxides, nitrides, or combinations of oxides and nitrides, and can vary in thickness depending upon the application. In various examples, the dielectric capping layer 122 can be formed in-situ when the SOT layer 124 is formed. In another example, the dielectric capping layer 122 can be formed in a different process chamber (ex-situ) than the process chamber used to form the SOT layer 124. The structure in FIG. 1 is formed in part by etching a target stack that includes the MTJ stack 110, the SOT layer 124, and the dielectric capping layer 122.

Further in the SOT-MRAM device 100, an encapsulation layer 106 extends circumferentially around the MTJ stack 110 and along the oxide layer 104. The encapsulation layer 106 can be formed from one or more dielectric materials such as SiN, SiCN, SiON, $Al_2O_3$, or other materials. The encapsulation layer 106 is formed to cover the sidewalls 110A of the MTJ stack 110, a sidewall 126 of the SOT layer 124, and the dielectric capping layer 122. The encapsulation layer 106 further extends along a top surface 128 of the dielectric capping layer 122 and a sidewall 132 of the dielectric capping layer 122. In an example, the encapsulation layer 106 extends along the sidewall 126 of the SOT layer 124 for a distance that is from about 1% to about 60% of a thickness 130 of the SOT layer 124. The encapsulation layer 106 extends along a portion of the sidewall 126 of the SOT layer 124 to protect the free layer 118 from patterning processes. The encapsulation layer 106 further acts to separate the metal contact 102 from a dielectric fill layer 108.

The dielectric fill layer 108 is formed to encompass the encapsulation layer 106. The dielectric fill layer 108 can be formed one or more oxides and/or nitrides to a thickness from about 10 nm to about 100 nm. In one example, the dielectric fill layer 108 is formed from silicon dioxide ($SiO_2$). A metal layer 120 surrounds the dielectric capping layer 122 and the SOT layer 124. The metal layer 120 can be formed from copper (Cu), W, Ta, tantalum nitride (TaN), titanium (Ti), titanium nitride (TiN), or combinations thereof. The metal layer 120 can be referred to as a metal line or metal lines, since the metal layer 120 electrically couples to the SOT layer 124 and acts to transfer current through the SOT layer 124. In one example, the metal layer 120 is not in contact with the top surface 134 of the SOT layer 124, which prevents current loss during device operation. In various examples, depending upon factors including the cross-sectional geometry of a top-view of the SOT layer 124, the metal layer 120 can contact two or more regions along the sidewall 126 of the SOT layer 124. In one example, the metal layer 120 contacts less than all of the sidewall 126 of the SOT layer 124.

Figure 2A:
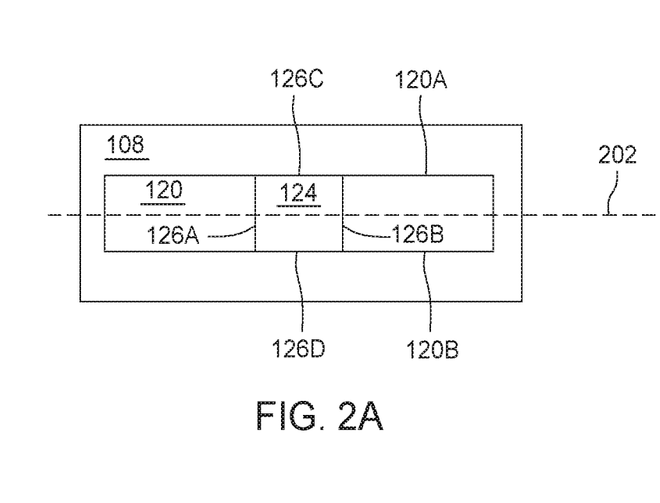
FIGS. 2A-2D illustrate top-down views SOT-MRAM devices fabricated according to embodiments of the present disclosure.
Figure 2B:
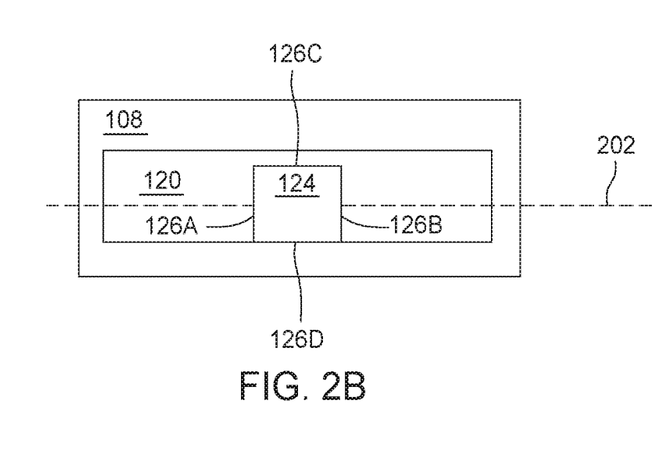
Figure 2C:
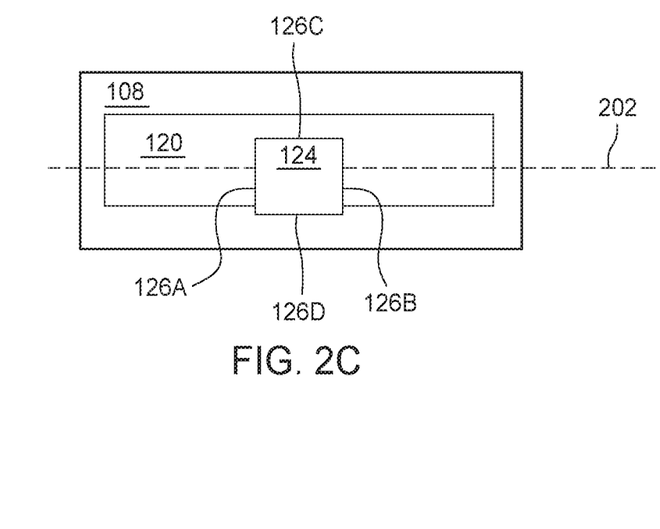
Figure 2D:
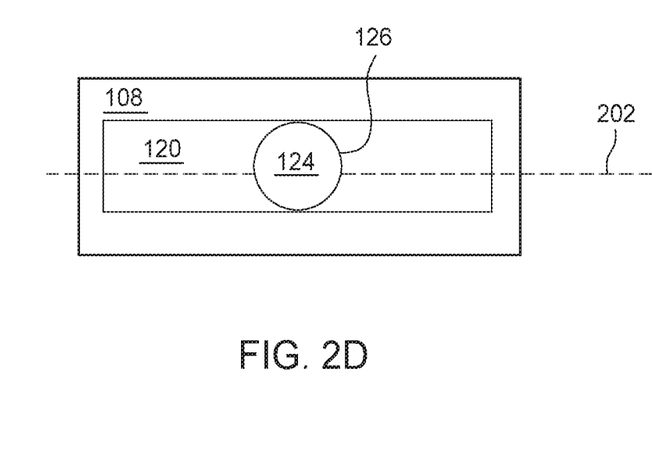

FIGS. 2A-2D illustrate top-down views of examples of SOT-MRAM devices fabricated according to embodiments of the present disclosure. While the top-down views shown in FIGS. 2A-2C are shown to be polygons resembling squares, it is contemplated in other examples that the cross-sectional geometry of the top-view that includes the SOT layer 124 can be a circle (as shown in FIG. 2D), ellipse, triangle, or other shape or combinations of shapes that can be aligned in various manners with the metal layer 120. Each of FIGS. 2A-2D is illustrated without the dielectric capping layer 122, which is formed on top of the SOT layer 124 as shown in FIG. 1. Rather, FIGS. 2A-2D are used to illustrate the position of the SOT layer 124 relative to the metal layer 120 and the dielectric fill layer 108. Conventionally, if the SOT layer 124 is misaligned with the metal layer 120, current loss can occur. However, in examples of the SOT-MRAM devices discussed herein, misalignment does not have a similar effect, at least because of how the metal layer 120 is electrically coupled to two or more portions of the sidewall 126 of the SOT layer 124.

FIG. 2A shows an example SOT-MRAM device that has the SOT layer 124 aligned along a central axis 202 shared with the metal layer 120, fabricated according to embodiments of the present disclosure. Depending upon the embodiment, the metal layer 120 can be in direct contact with two parallel sidewall portions 126A and 126B or 126C and 126D of the SOT layer 124. In FIG. 2A, the third sidewall portion 126C and the fourth sidewall portion 126D are aligned with the sides (120A, 120B) of metal layer 120. In contrast to conventional devices where the sidewalls of the SOT layer 124 and the metal layer 120 are not aligned, the metal layer 120 in FIG. 2A is aligned with two sidewalls (126C, 126D) of the SOT layer 124. The sidewall 126 of the SOT layer 124 is shown in FIG. 1, and is further shown in FIG. 2A as a first sidewall portion 126A, a second sidewall portion 126B, a third sidewall portion 126C, and a fourth sidewall portion 126D. The first sidewall portion 126A is opposite of and parallel to the second sidewall portion 126B. The third sidewall portion 126C is opposite of and parallel to the fourth sidewall portion 126D.

FIG. 2B shows a structure similar to FIG. 2A, but in contrast to FIG. 2A, the SOT layer 124 in FIG. 2B is offset from the central axis 202 and at least one sidewall portion such as the fourth sidewall portion 126D can be in direct contact with the dielectric fill layer 108. FIG. 2C shows a structure similar to FIGS. 2A and 2B, however, in contrast to FIGS. 2A and 2B, the SOT layer 124 is further offset (misaligned) from the central axis 202 such that a portion of the SOT layer 124 overhangs the metal layer 120 along the fourth sidewall portion 126D. FIG. 2D shows a structure similar to FIG. 2A with a circular cross-sectional shape defined by the sidewall 126. In this example, the metal layer 120 can be in contact with all of the sidewall 126 or with less than all of the sidewall 126, for example, for 10%-90% of the circumference of the sidewall 126.

In any of the examples in FIGS. 2A-2D, the SOT-MRAM device transmits current through the SOT layer 124 via the metal lines formed by the metal layer 120 that are electrically coupled to the SOT layer 124. As discussed below, the metal layer 120 is not disposed on top of the SOT layer 124 which reduces the current loss and increases the switching efficiency of the SOT-MRAM device.

In some examples, as shown and discussed in FIGS. 3 and 4A-4F below, the third sidewall portion 126C and the fourth sidewall portion 126D are in contact with the dielectric fill layer 108. In other examples, as shown and discussed in FIGS. 5 and 6A-6H below, the third sidewall portion 126C and the fourth sidewall portion 126D are not in contact with the dielectric fill layer 108. In other examples, as shown and discussed in FIGS. 5 and 6A-6H the metal layer 120 can be in direct contact with all of the sidewall portions 126A, 126B, 126C, 126D of the SOT layer 124.

The bottom-pinned SOT-MRAM devices discussed herein can be fabricated in various manners. Example methods and structures resulting from those methods are discussed below. Various elements of the methods below can be combined and utilized to form the SOT-MRAM structures discussed herein. Depending upon the example, the metal layer 120, that is used to form the metal lines which electrically couple to the SOT layer 124, can be configured to contact two or more sidewall portions of the SOT layer 124. FIGS. 3-6H discuss various fabrication operations and sub-operations used to fabricate bottom-pinned SOT-MRAM structures, as well as structures resulting therefrom. It is contemplated that elements of methods discussed herein can be combined to form SOT-MRAM devices with high-quality MTJ stack/SOT layer interfaces and commercially viable magnetic and electrical properties.

Figure 3:
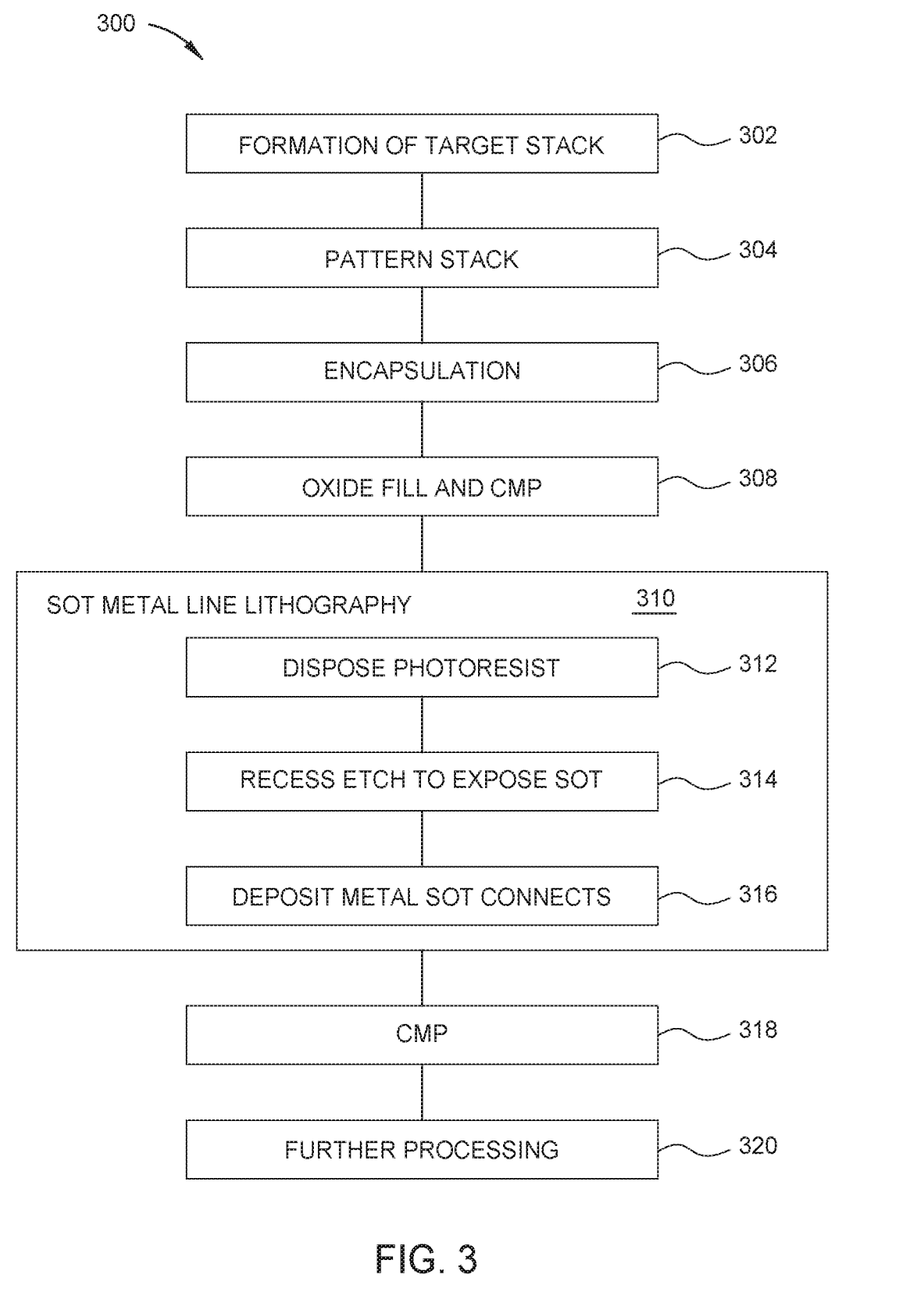
FIG. 3 is a flow chart of a method of fabricating SOT-MRAM according to embodiments of the present disclosure.
Figure 4A:
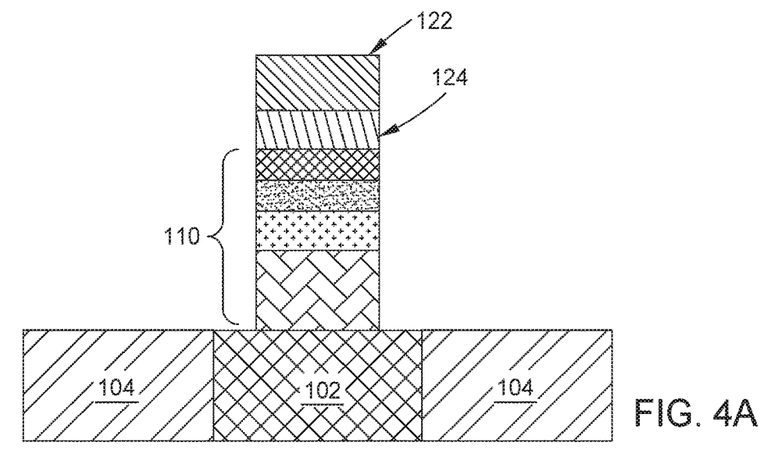
FIGS. 4A-4F are views of structures resulting from fabrication methods according to embodiments of the present disclosure.

FIG. 3 is a flow chart of a fabrication method 300 for SOT-MRAM according to embodiments of the present disclosure. FIGS. 4A-4F illustrate structures resulting from operations of the fabrication method 300. FIGS. 3 and 4A-4F are discussed together below and are directed towards forming the SOT-MRAM device of FIG. 1. Thus, the layers referenced in FIG. 1 are discussed below with respect to FIGS. 3 and 4. In the fabrication method 300, at operations 302 and 304, the structure in FIG. 4A is formed in a plurality of sub-operations including formation of a target stack and patterning of the target stack.

At operation 302, a target stack is formed that includes an MTJ stack 110 formed on a metal contact 102, an SOT layer 124 formed over the MTJ stack 110, and a dielectric capping layer 122 formed over the SOT layer. The MTJ stack 110 can be formed at operation 302 in a series of physical vapor deposition (PVD) sputtering sub-operations without breaking vacuum in between formation of the layers. Accordingly, each of the pinning layer 112, the reference layer 114, the tunnel barrier layer 116, and the free layer 118 is formed in a process chamber held under vacuum pressure. One or more sputtering targets can be used in PVD sputtering operations to form the pinning layer 112 (e.g., from Co and/or Pt) and to form the reference layer 114 from CoFe, CoFeB, ruthenium (Ru) or combinations thereof. Further in sub-operations at operation 302, the tunnel barrier layer 116 is formed via PVD sputtering from magnesium oxide (MgO) or via PVD sputtering from magnesium (Mg) and subsequent oxidation, and the free layer 118 is formed by sputtering one or more targets to form a CoFeB layer.

Further in the sub-operations at operation 302, the SOT layer 124 is deposited on the MTJ stack 110 via PVD sputtering. As discussed above, the SOT layer 124 is formed from tungsten (W), tantalum (Ta), platinum (Pt), or combinations or alloys thereof to a thickness from 3 mm to 10 mm. Vacuum pressure is maintained in the one or more process chambers used for formation of the MTJ stack 110 between the formation of the outermost layer of the MTJ stack 110

(the free layer 118) and the formation of the SOT layer 124. Maintaining vacuum in between fabrication of the layers of the MTJ stack 110 and the SOT layer 124 promotes the formation of a high quality interface in between the layers of the MTJ stack and between the free layer 118 and the SOT layer 124. The high-quality interface formed under vacuum between the free layer 118 and the SOT layer 124 results in improved SOT-M RAM device performance.

Further at operation 302, the dielectric capping layer 122 can be formed in-situ or ex-situ (with or without breaking vacuum) at operation 302, using PVD, CVD or other methods or combinations of methods. In one example, the dielectric capping layer 122 is formed on the SOT layer 124 without breaking vacuum. In another example, the dielectric capping layer 122 is formed on the SOT layer 124 ex-situ where the vacuum is broken after the formation of the SOT layer 124 and may or may not be reestablished for the formation of the dielectric capping layer 122. Further sub-operations at operation 302 can include the deposition of one or more optional hardmask layers on the dielectric capping layer 122 (not shown here) that can be used for patterning at operation 304. The target stack formed in the sub-operations at operation 302 is patterned (etched) at operation 304 to form a plurality of structures, one of which is shown in FIG. 4A. Each structure formed from the target stack includes the MTJ stack 110, the SOT layer 124, and the dielectric capping layer 122. Each structure is in contact with the metal contact 102. As shown above in FIGS. 2A-2C each structure formed from the target stack during operation 302 can have a top-down cross section of a polygon, including a rectangle or a square, a circle, an ellipse, a triangle, or combinations thereof.

Figure 4B:
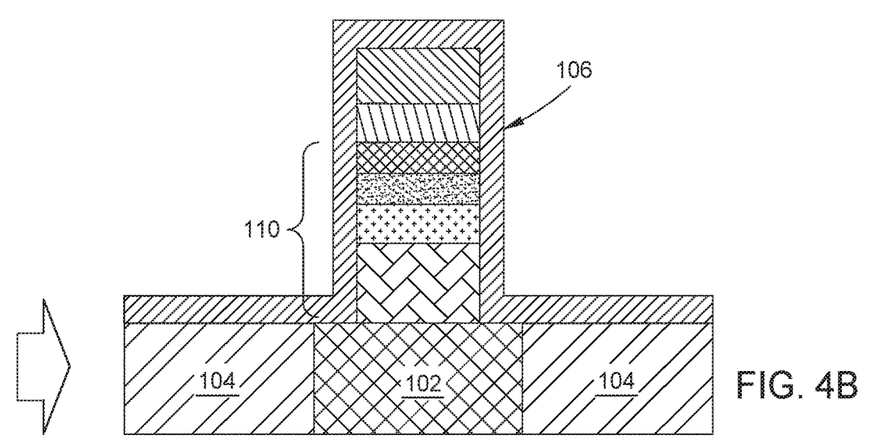
Figure 4C:
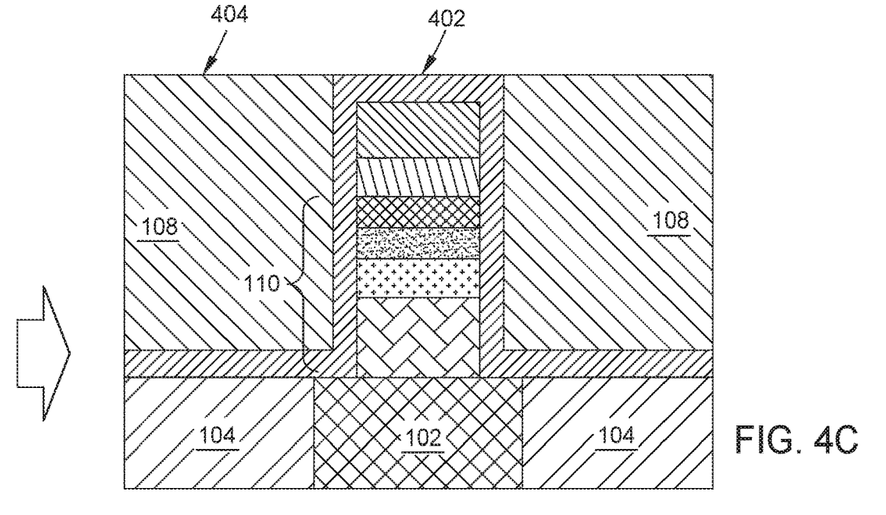

At operation 306, an encapsulation layer 106 is formed around the patterned structures of FIG. 4A to encapsulate the MTJ stack 110, the SOT layer 124, and the dielectric capping layer 122 to form a structure shown in FIG. 4B. The encapsulation layer 106 can be formed at operation 306 using CVD, atomic layer deposition (ALD), or PVD. The encapsulation layer 106 protects the MTJ stack 110 during fabrication, for example, by preventing the MTJ stack from oxidation. The encapsulation layer 106 can be formed from SiN, SiCN, SiON, $Al_2O_3$, or other materials or combinations of materials to various thicknesses, for example, from 5 nm to 30 nm.

At operation 308, a dielectric fill layer 108 is deposited on the encapsulation layer 106 and planarized. The dielectric fill layer 108 can be deposited at operation 308 using CVD. During planarization at operation 308, a portion of the dielectric fill layer 108 can be removed using chemical mechanical polishing (CMP) to form a top 404 of the dielectric fill layer 108 that is substantially co-planar with a top 402 of the encapsulation layer 106, as shown in FIG. 3C.

Figure 4D:
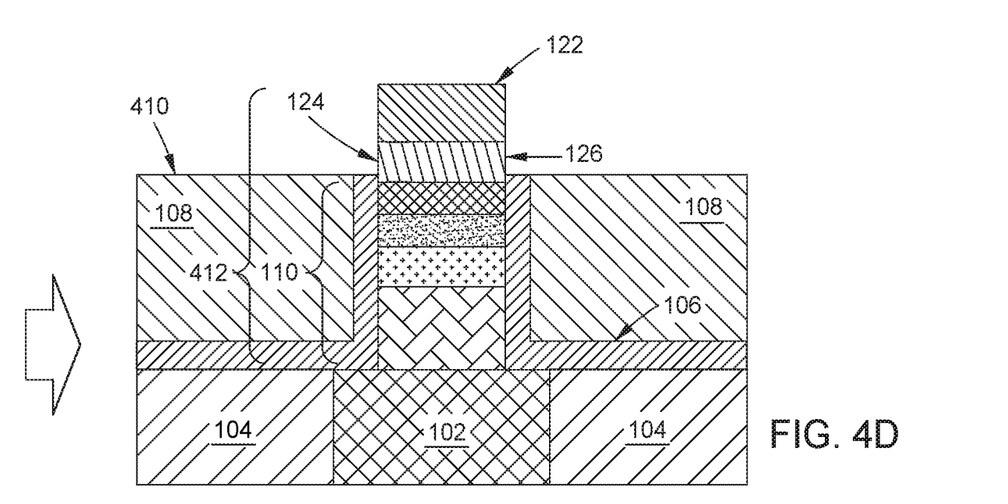
Figure 4E:
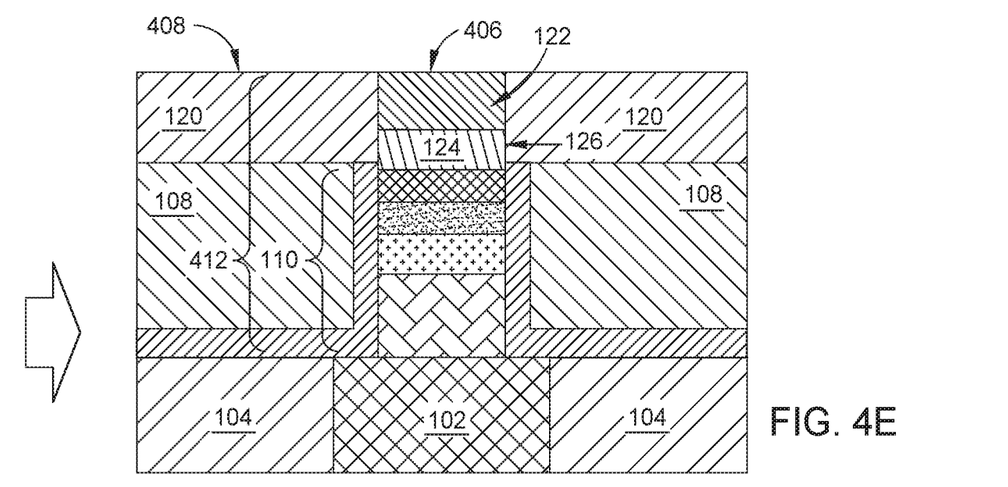
Figure 4F:
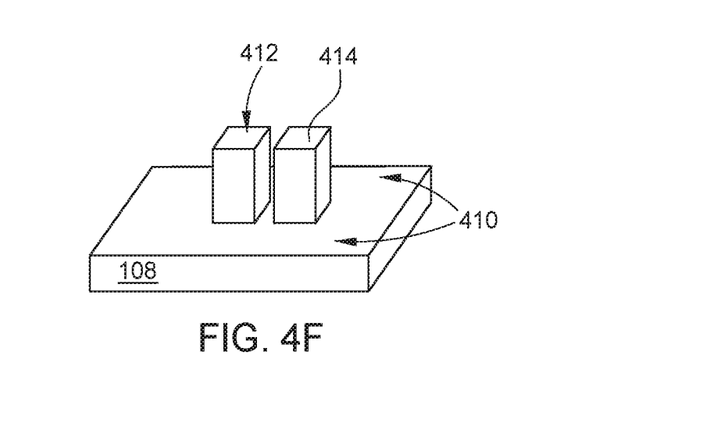

At operation 310, SOT metal line lithography is performed to form metal lines that electrically couple to the SOT layer 124 to transfer current through the SOT layer 124. Operation 310 includes sub-operations 312-316. At sub-operation 312, a photoresist is disposed on top of the structure of FIG. 4C and is subsequently patterned. At operation 314, a recess is etched using the photoresist formed and patterned at sub-operation 312. The etching at operation 314 is a selective etching operation that removes the dielectric fill layer 108 and the encapsulation layer 106 but does not etch the dielectric capping layer 122 as much. During etching at operation 314, a portion of the dielectric fill layer 108 and a portion of the encapsulation layer 106 are removed to form a trench 410. The formation of the trench 410 exposes all or portion of four sidewalls 126 of the SOT layer 124. FIG. 4D shows a structure resulting from operation 314. In particular, FIG. 4D shows a first structure 412 where a portion of the dielectric fill layer 108 and a portion of the encapsulation layer 106 have been removed. The formation of the trench 410 exposes the top of the dielectric capping layer 122 and two or more portions of the sidewall 126 of the SOT layer 124. As discussed above, the encapsulation layer 106 may not be removed entirely from the sidewall 126 of the SOT layer 124. The portion of the encapsulation layer 106 remaining on the sidewall 126 of the SOT layer 124 protects the underlying free layer 118 during etching at operation 314. In one example, a height from about 10% to about 90% of the sidewall 126 of the SOT layer 124 can be exposed at operation 314. FIG. 4F is a perspective view showing a plurality of structures including the first structure 412 and a second structure 414 formed from a target stack as discussed above. FIG. 4F further illustrates a trench 410 formed through the dielectric fill layer 108. Each of the first structure 412 and the second structure 414 which includes the MTJ stack 110, the SOT layer 124, and the capping layer 122.

At operation 316, the metal layer 120 is deposited in the trench 410 formed at operation 314 to form metal lines that are electrically coupled to the sidewall 126 of the SOT layer 124. The first structure 412 is further illustrated in FIG. 4E. The metal layer 120 can be deposited via CVD or PVD at operation 314. Further at operation 318, the metal layer 120 can be planarized to remove a portion via CMP such that a top surface 406 of the dielectric capping layer 122 is co-planar with a top surface 408 of the metal layer 120, as shown in FIG. 4E. At operation 320, further operations can be executed on the SOT-MRAM device, including annealing operations. The structure shown in FIG. 4E is fabricated to withstand further processing at temperatures on the order of 400° C. while maintaining commercially viable electrical and magnetic properties.

The SOT-MRAM devices discussed herein can be formed as shown and discussed in FIGS. 3 and 4A-4F where a trench is formed and filled with metal material to form the metal lines that electrically couple to the SOT layer. In other examples, as shown and discussed below in FIGS. 5 and 6A-6H, a recess can be formed in the dielectric fill layer instead of the trench, exposing additional surface area of the SOT layer to couple to the metal lines formed from the metal layer.

Figure 5:
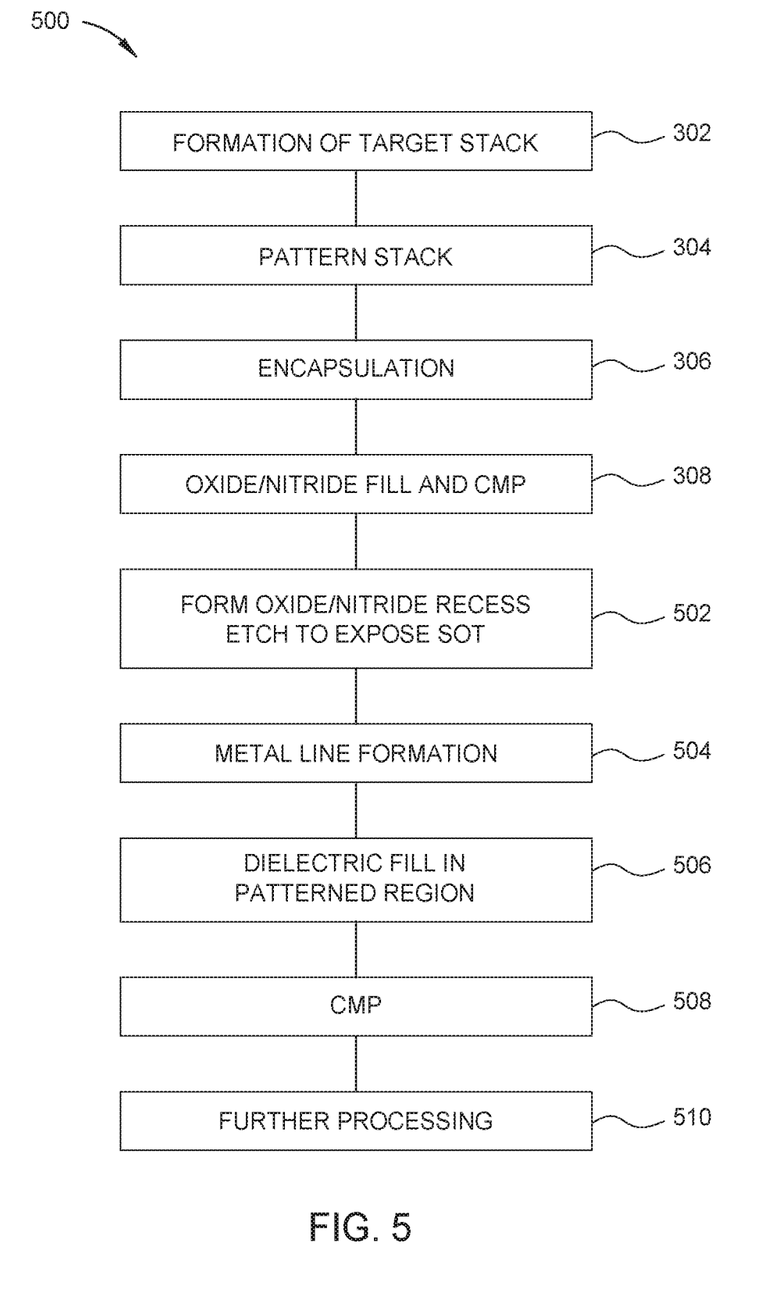
FIG. 5 is a flow chart of a method of fabricating SOT-MRAM according to embodiments of the present disclosure.
Figure 6A:
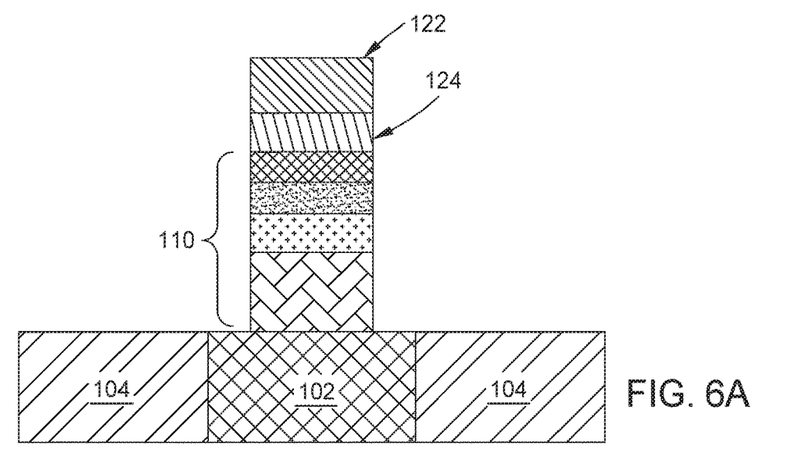
FIGS. 6A-6H illustrate structures resulting from fabrication methods according to embodiments of the present disclosure.
Figure 6B:
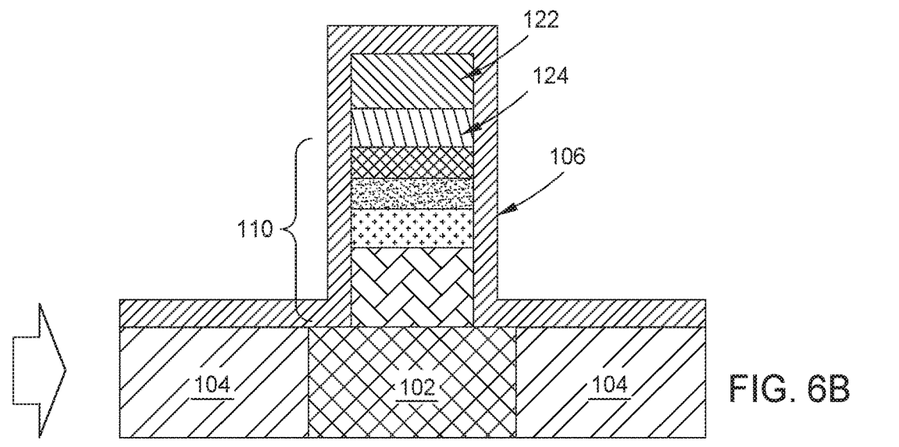
Figure 6C:
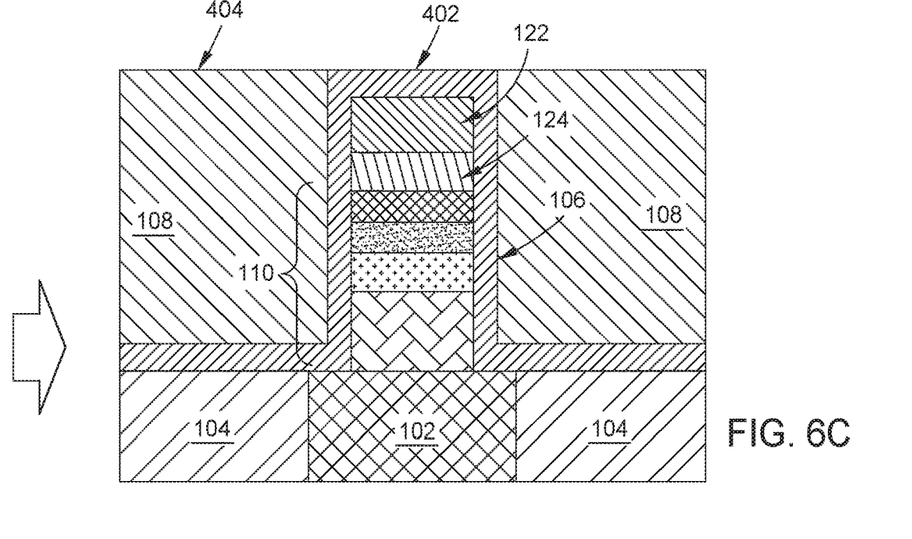

FIG. 5 is a flow chart of a fabrication method 500 for SOT-MRAM devices according to embodiments of the present disclosure. FIGS. 6A-6G illustrate structures resulting from operations of the fabrication method 500. In the fabrication method 500, operations 302, 304, and 306 are performed as discussed above with respect to the fabrication method 300 to form the MTJ stack 110 and SOT layer 124 under vacuum. Also as discussed above, the dielectric capping layer 122 is formed on the SOT layer 124 and the MTJ stack 110 is patterned to form a plurality of structures, an example structure is shown in FIG. 6A. The structure of FIG. 6A is encapsulated at operation 306 with the encapsulation layer 106, the resulting structure is shown in FIG. 6B. At operation 308, a dielectric fill layer 108 is formed on the encapsulation layer 106. The dielectric fill layer 108 can include an oxide, a nitride, or alternating layers of oxides and nitrides. Further at operation 308, the dielectric fill layer 108 is planarized via CMP. After planarization at operation 308, the top 402 of the encapsulation layer 106 is co-planar with the top 404 of the dielectric fill layer 108, as shown in FIG. 6C.

Figure 6D:
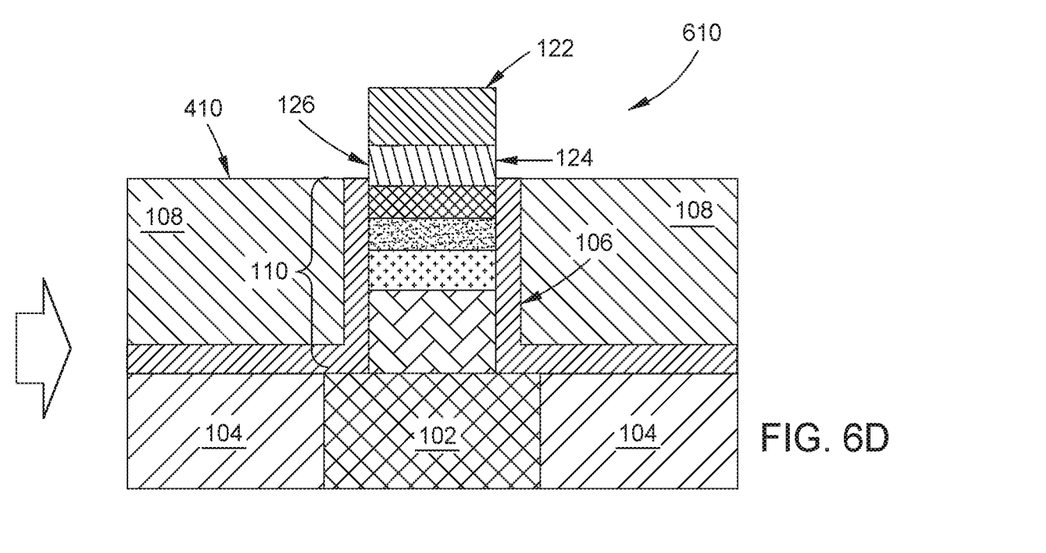
Figure 6E:
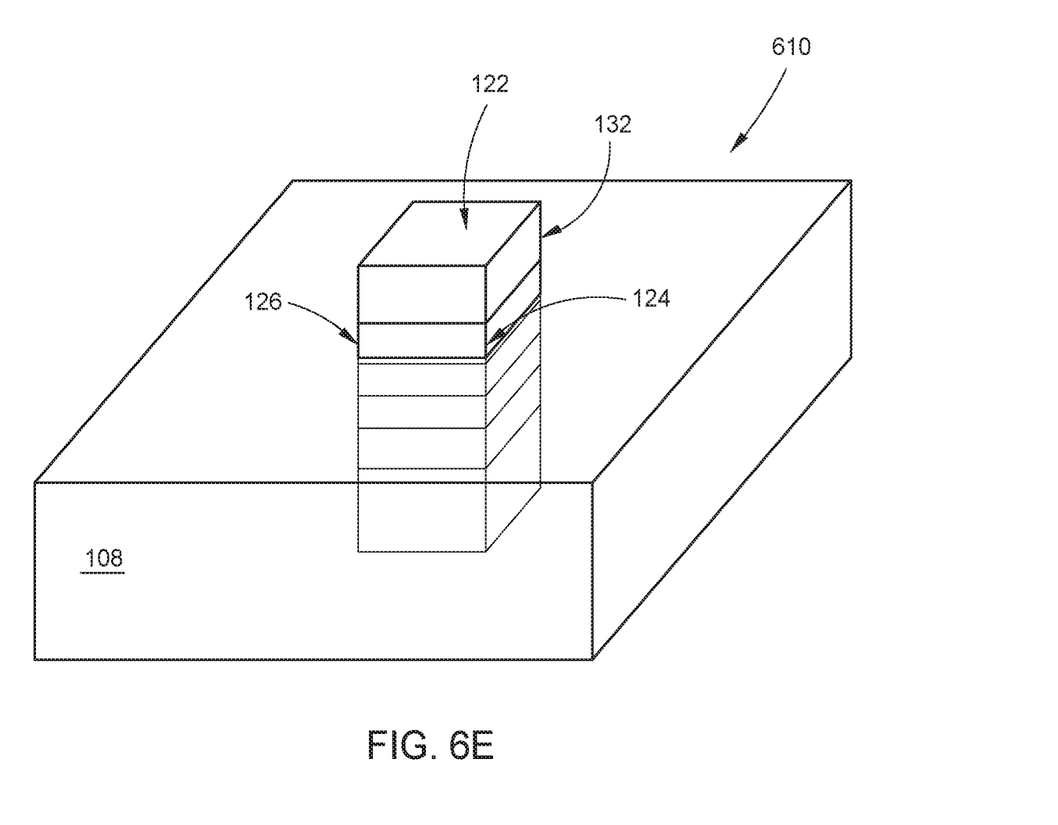

At operation 502, a recess 610 is formed in the dielectric fill layer 108, FIG. 6D as a cross-section and in FIG. 6E as a perspective view. As shown in FIGS. 6D and 6E, the recess 610 in the dielectric fill layer 108 is formed around the entire (all four sides of) the SOT layer 124 and the dielectric capping layer 122. The recess 610 can be formed at operation 502 using etching without lithography. The formation of the recess at operation 502 removes a portion of the dielectric fill layer 108 and a portion of the encapsulation layer 106. The recess 610 is formed to expose at least a portion of all four sides (sidewall portions) of the sidewall 126 of the SOT layer 124. In contrast, in some examples the trench 410 formed at operation 308 in the fabrication method 300 is formed such that two parallel sidewalls of the SOT layer 124 are exposed and the remaining two sidewalls are not exposed, and thus remain in contact with the dielectric fill layer 108. In other examples, the trench 410 formed at operation 308 can expose more than two sidewall portions.

Figure 6F:
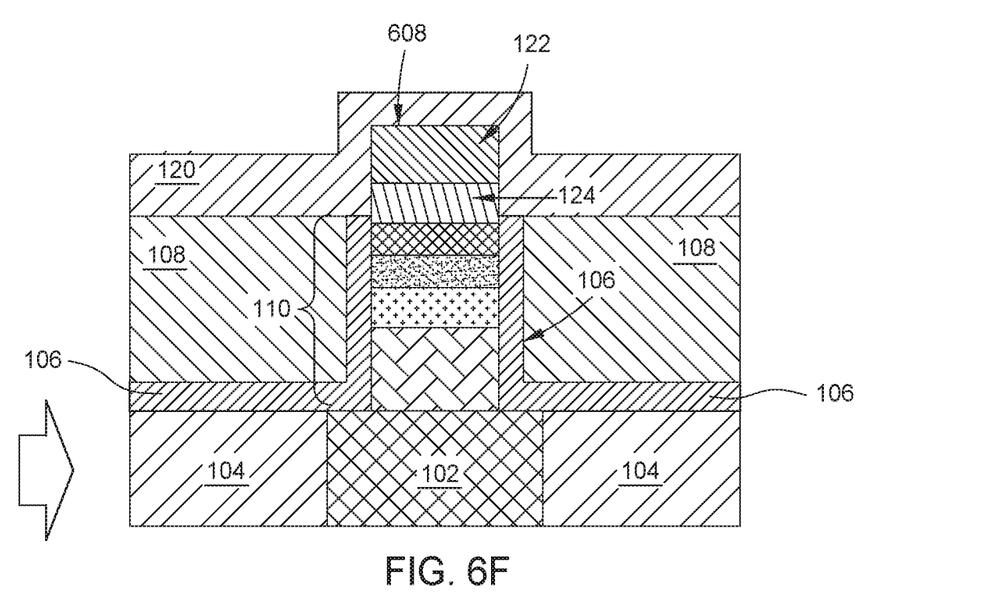
Figure 6G:
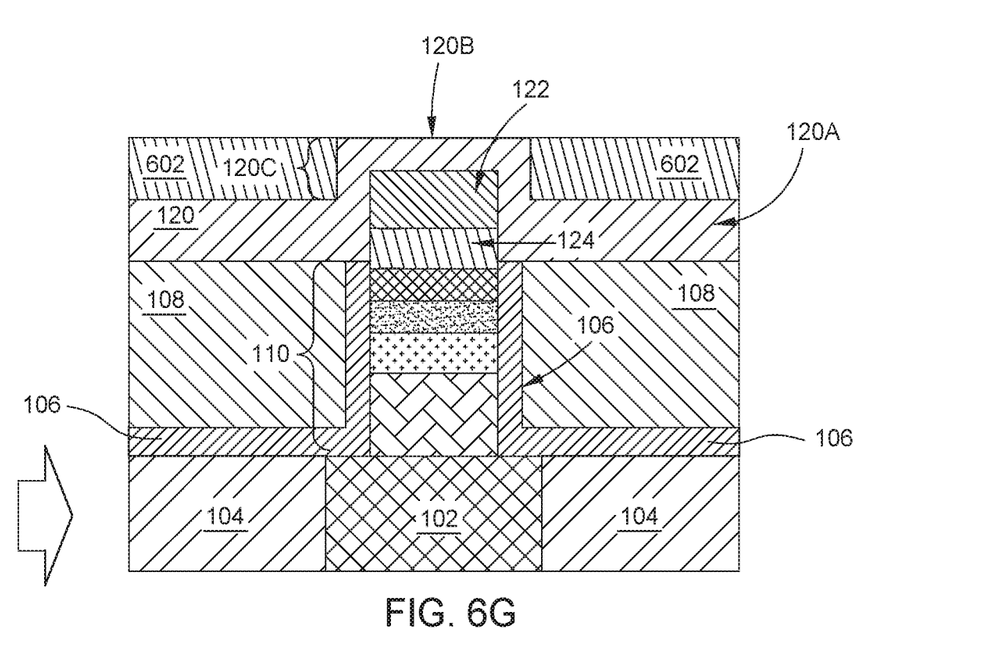

At operation 504, the metal layer 120 is deposited, using CVD or PVD, and subsequently patterned via lithography. The metal layer 120 is formed to contact and electrically couple to one or more portions of the sidewall 126 of the SOT layer 124 that were exposed at operation 502. The structure resulting from operation 504 is shown at FIG. 6F, which shows that the metal layer 120 can be in further contact with a top surface 608 of the dielectric capping layer 122. FIG. 6F shows the metal layer 120 to include two portions. A first portion 120A of the metal layer 120 is formed on the dielectric fill layer 108. A second portion 120B of the metal layer 120 is formed over the dielectric capping layer 122 and extends for a distance 120C beyond the first portion 120A. At operation 506, the patterned surface that results from the metal lithography at operation 504 (not shown in the cross-sectional views herein), is filled with a dielectric material 602, as shown in FIG. 6G. The dielectric material 602 can be deposited at operation 506 using CVD. In another example, the dielectric material 602 can be deposited at operation 506 using PVD. The dielectric material 602 can include one or more oxides, nitrides, or other dielectric materials or layers of dielectric materials. In one example, the dielectric material 602 includes a plurality of alternating oxide and nitride layers.

Figure 6H:
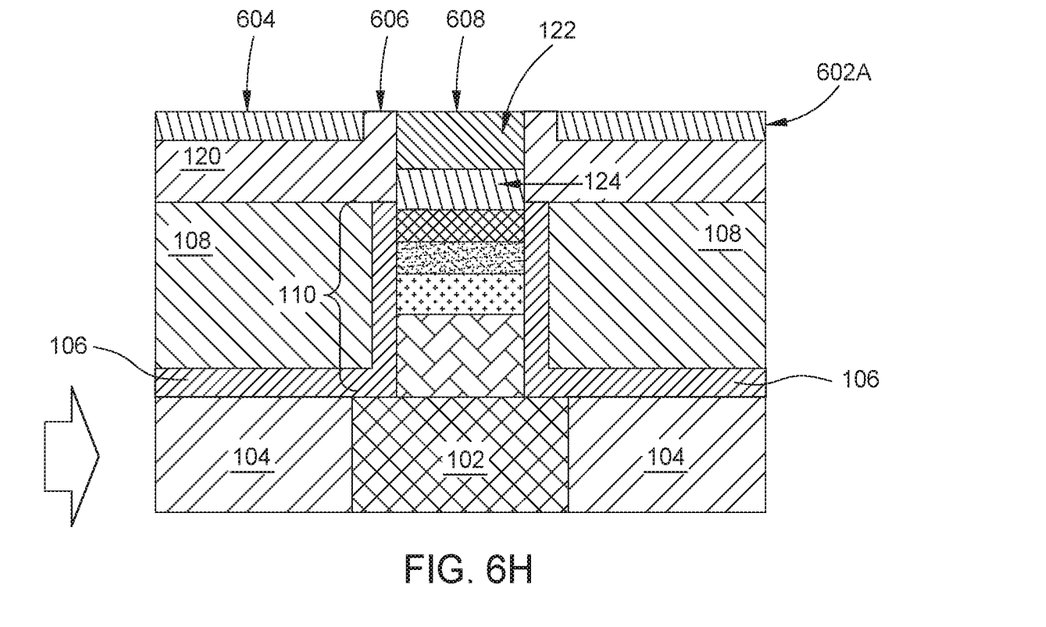

At operation 508, CMP is used to remove at least a portion of the dielectric material 602 to planarize the surface of the structure. As shown in FIG. 6H, the planarization at operation 508 makes the top surface 608 of the dielectric capping layer 122 co-planar with a top surface 604 of the dielectric material 602. The planarization at operation 508 additionally causes the top surface 608 of the dielectric capping layer 122 to be co-planar with a top surface 606 of the metal layer 120. While a portion 602A of the dielectric material 602 is shown in FIG. 6H remaining after CMP at operation 508, it is contemplated that, in other embodiments, operation 508 removes substantially all of the dielectric material 602 to expose the metal layer 120. At operation 510 further operations can be executed on the SOT-MRAM device, including annealing operations. The structure shown in FIG. 46H is fabricated to withstand further processing at temperatures up to 450° C. while maintaining commercially viable electrical and magnetic properties. At operation 510, the SOT-MRAM device formed at operations 302-308 and 502-508 can undergo further processing including thermal treatments.

The bottom-pinned SOT-MRAM devices discussed herein are fabricated to form the MTJ stack and the SOT layer under vacuum to create a high quality interface between the free layer of the MTJ stack and the SOT layer. Further, the SOT-MRAM devices fabricated according to embodiments of the present disclosure are formed to couple the metal lines to one or more of the sides of the SOT layer without contacting top of the SOT layer. The encapsulation layer is used as a protective layer to protect the free layer of the MTJ stack, in contrast to a top-pinned structure that uses the SOT layer as the etch stop. The encapsulation layer is further configured to protect the free layer of the MTJ stack and a portion of the SOT layer to prevent etching of the free layer. In addition, the bottom-pinned SOT-MRAM device can be configured to have an improved overlay margin with respect to the MTJ stack and the SOT layer to decrease the current flow loss and improve switching efficiency.

While the foregoing is directed to embodiments of the present disclosure, other and further embodiments of the disclosure may be devised without departing from the basic scope thereof, and the scope thereof is determined by the claims that follow.

What is claimed is:

1. A method of forming a memory device, comprising:
depositing an encapsulation layer on a first structure, the first structure comprising a magnetic tunnel junction stack, a spin-orbit torque layer formed on the magnetic tunnel junction stack, and a dielectric capping layer formed over the spin-orbit torque layer;
depositing a dielectric layer on the encapsulation layer;
forming a trench in the dielectric layer by removing a portion of the dielectric layer and a portion of the encapsulation layer; and
depositing, via at least one of chemical vapor deposition (CVD) or physical vapor deposition (PVD), a metal layer in the trench, the metal layer being deposited on top of the dielectric layer and surrounding the spin-orbit torque layer and the dielectric capping layer, the metal layer being in direct contact with a sidewall of the spin-orbit torque layer.

2. The method of claim 1, wherein the spin-orbit torque layer is formed from tungsten (W), tantalum (Ta), platinum (Pt), or combinations or alloys thereof to a thickness from 3 mm to 10 mm.

3. The method of claim 1, wherein forming the trench exposes the dielectric capping layer and a first sidewall portion of the sidewall of the spin-orbit torque layer, wherein, subsequent to forming the trench, the encapsulation layer being in direct contact with a second sidewall portion of the spin-orbit torque layer, the second sidewall portion being adjacent to the magnetic tunnel junction stack.

4. The method of claim 1, wherein the encapsulation layer is formed from SiN, SiCN, SiON, or $Al_2O_3$.

5. The method of claim 1, wherein forming the trench comprises removing the portion of the dielectric layer and the portion of the encapsulation layer from at least two sides of the spin-orbit torque layer.

6. The method of claim 1, further comprising forming a target stack, wherein forming the target stack comprises:
depositing, on a substrate positioned in a process chamber under vacuum pressure, the magnetic tunnel junction stack, wherein forming the magnetic tunnel junction stack comprises:
depositing a pinning layer on the substrate;
depositing a reference layer on the pinning layer;
depositing a tunnel barrier layer on the reference layer; and
depositing a free layer on the tunnel barrier layer;
depositing, the spin-orbit torque layer on the free layer of the magnetic tunnel junction stack while the magnetic tunnel junction stack remains under vacuum pressure; and depositing the dielectric capping layer on the spin-orbit torque layer.

7. The method of claim 6, further comprising patterning the target stack to form a plurality of structures including the first structure.

8. The method of claim 1, further comprising planarizing the metal layer to expose the dielectric capping layer, wherein, subsequent to planarizing the metal layer, a first top surface of the metal layer is co-planar with a second top surface of the dielectric capping layer.

9. A method of forming a memory device, comprising:
depositing a first dielectric layer on an encapsulation layer formed over a first structure, the first structure comprising a magnetic tunnel junction stack, a spin-orbit torque layer formed on the magnetic tunnel junction stack, and a dielectric capping layer formed over the spin-orbit torque layer;
forming a trench in the first dielectric layer by removing a portion of the first dielectric layer and a portion of the encapsulation layer;
depositing, via at least one of chemical vapor deposition (CVD) or physical vapor deposition (PVD), a metal layer in the trench, the metal layer being deposited on top of the first dielectric layer and surrounding the spin-orbit torque layer and the dielectric capping layer, the metal layer being in direct contact with a sidewall of the spin-orbit torque layer; and
depositing a second dielectric fill layer on the metal layer.

10. The method of claim 9, wherein depositing the metal layer in the trench comprises depositing the metal layer to include a first portion of the metal layer and a second portion of the metal layer that extends for a predetermined distance beyond the first portion.

11. The method of claim 10, wherein the first portion is formed on the second dielectric fill layer and the second portion is formed on the dielectric capping layer, the first portion being further in contact with the spin-orbit torque layer.

12. The method of claim 9, further comprising: planarizing a second dielectric layer to expose the dielectric capping layer, wherein, subsequent to planarizing the second dielectric layer, a first top surface of the second dielectric layer is co-planar with a second top surface of the dielectric capping layer.

13. The method of claim 12, wherein planarizing the second dielectric layer further comprises exposing a portion of the metal layer, the portion of the metal layer being adjacent to the dielectric capping layer.

14. The method of claim 12, wherein planarizing the second dielectric layer comprises leaving a portion of the second dielectric layer on a first portion of the metal layer.

15. The method of claim 9, further comprising forming a target stack, wherein forming the target stack comprises:
depositing, on a substrate positioned in a process chamber under vacuum pressure, the magnetic tunnel junction stack, wherein forming the magnetic tunnel junction stack comprises:
depositing a pinning layer on the substrate;
depositing a reference layer on the pinning layer;
depositing a tunnel barrier layer on the reference layer; and
depositing a free layer on the tunnel barrier layer;
depositing the spin-orbit torque layer on the free layer of the magnetic tunnel junction stack while the magnetic tunnel junction stack remains under vacuum pressure; and
depositing the dielectric capping layer on the spin-orbit torque layer.

16. The method of claim 15, further comprising patterning the target stack to form a plurality of structures including the first structure.

17. A method of forming a memory device, comprising:
depositing, on a substrate positioned in a process chamber under vacuum pressure, a magnetic tunnel junction stack;
depositing a spin-orbit torque layer on a free layer of the magnetic tunnel junction stack while the magnetic tunnel junction stack remains under vacuum pressure;
depositing a dielectric capping layer on the spin-orbit torque layer;
depositing an encapsulation layer on a first structure, the first structure comprising the magnetic tunnel junction stack, the spin-orbit torque layer, and the dielectric capping layer formed over the spin-orbit torque layer;
depositing a first dielectric layer on the encapsulation layer;
forming a trench in the first dielectric layer by removing a portion of the first dielectric layer and a portion of the encapsulation layer; and
depositing, via at least one of chemical vapor deposition (CVD) or physical vapor deposition (PVD), a metal layer in the trench, the metal layer being deposited on top of the first dielectric layer and surrounding the spin-orbit torque layer and the dielectric capping layer, the metal layer being in direct contact with a sidewall of the spin-orbit torque layer.

18. The method of claim 17, wherein depositing the metal layer in the trench comprises depositing the metal layer to include a first portion of the metal layer and a second portion of the metal layer that extends for a predetermined distance beyond the first portion.

19. The method of claim 18, wherein the first portion is formed on the first dielectric layer and the second portion is formed on the dielectric capping layer, the first portion being further in contact with the spin-orbit torque layer.

20. The method of claim 18, further comprising:
depositing a second dielectric layer on the metal layer; and
planarizing the second dielectric layer to expose the dielectric capping layer, wherein, subsequent to planarizing the second dielectric layer, a first top surface of the second dielectric layer is co-planar with a second top surface of the dielectric capping layer.

* * * * *